(12) United States Patent
Kozlovski (10) Patent No.: US 10,980,131 B2
(45) Date of Patent: Apr. 13, 2021

(54) CHIP EMBEDDED PRINTED CIRCUIT BOARDS AND METHODS OF FABRICATION

(71) Applicants: NANO-DIMENSION TECHNOLOGIES, LTD., Nes Ziona (IL); THE IP LAW FIRM OF GUY LEVI, LLC, Wyckoff, NJ (US)

(72) Inventor: Dan Kozlovski, Rehovot (IL)

(73) Assignee: Nano Dimension Technologies, Ltd., Nes Ziona (IL)

(*) Notice: Subject to any disclaimer, the term of this patent is extended or adjusted under 35 U.S.C. 154(b) by 0 days.

(21) Appl. No.: 16/478,080

(22) PCT Filed: Jan. 24, 2018

(86) PCT No.: PCT/US2018/015075
§ 371 (c)(1),
(2) Date: Jul. 15, 2019

(87) PCT Pub. No.: WO2018/140517
PCT Pub. Date: Aug. 2, 2018

(65) Prior Publication Data
US 2019/0373738 A1 Dec. 5, 2019

Related U.S. Application Data

(60) Provisional application No. 62/450,722, filed on Jan. 26, 2017.

(51) Int. Cl.
*B33Y 10/00* (2015.01)
*H05K 13/04* (2006.01)
(Continued)

(52) U.S. Cl.
CPC .............. *H05K 3/125* (2013.01); *B33Y 10/00* (2014.12); *G06F 30/39* (2020.01); *H05K 1/092* (2013.01);
(Continued)

(58) Field of Classification Search
None
See application file for complete search history.

(56) References Cited

U.S. PATENT DOCUMENTS

2006/0072944 A1 4/2006 Sharma et al.
2014/0374375 A1 12/2014 Zwiers et al.
(Continued)

FOREIGN PATENT DOCUMENTS

WO WO-2016077844 A1 * 5/2016 ............ H05K 3/4664

*Primary Examiner* — Jose I Hernandez-Kenney
(74) *Attorney, Agent, or Firm* — Guy Levi; The IP Law Firm of Guy Levi, LLC (57) ABSTRACT

The disclosure relates to systems, methods and compositions for direct printing of printed circuit boards with embedded integrated chips. Specifically, the disclosure relates to systems methods and compositions for the direct, top-down inkjet printing of printed circuit board with embedded chip and/or chip packages using a combination of print heads with conductive and dielectric ink compositions, creating predetermined dedicated compartments for locating the chips and/or chip packages and covering these with an encapsulating layer while maintaining interconnectedness among the embedded chips. Placing of the chips can be done automatically using robotic arms.

13 Claims, 4 Drawing Sheets

(51) Int. Cl.
*H05K 3/00* (2006.01)
*H05K 3/12* (2006.01)
*H05K 3/20* (2006.01)
*H05K 3/46* (2006.01)
*G06F 30/39* (2020.01)
*H05K 1/09* (2006.01)

(52) U.S. Cl.
CPC ........... *H05K 3/0005* (2013.01); *H05K 3/207* (2013.01); *H05K 3/4664* (2013.01); *H05K 13/0408* (2013.01)

(56) References Cited

U.S. PATENT DOCUMENTS

| | | | |
|---|---|---|---|
| 2015/0104562 A1 | 4/2015 | Subbaraman et al. | |
| 2015/0197062 A1 | 7/2015 | Shinar | |
| 2016/0198576 A1* | 7/2016 | Lewis | B29C 64/00 361/761 |
| 2016/0381844 A1* | 12/2016 | Knox | H05K 3/1241 29/739 |
| 2017/0042034 A1* | 2/2017 | MacCurdy | H01L 27/01 |

* cited by examiner

CHIP EMBEDDED PRINTED CIRCUIT BOARDS AND METHODS OF FABRICATION

CROSS REFERENCE TO RELATED APPLICATIONS

This patent application is a U.S. National Phase filing of commonly owned and pending PCT Application No. PCT/US18/15075, filed Jan. 24, 2018, which is based on and claims the benefit of the filing date of U.S. Provisional Patent Application Ser. No. 62/445,113, filed Jan. 16, 2017, both which are incorporated herein by reference in their entirely.

BACKGROUND

The disclosure is directed to systems, methods and compositions for direct printing of printed circuit boards (PCBs) with embedded integrated chips. Specifically, the disclosure is directed to systems methods and compositions for the direct inkjet printing of printed circuit board with embedded chip and/or chip packages using a combination of print heads with conductive and dielectric ink compositions, creating predetermined slots for locating the chips and/or chip packages and covering these with an encapsulating layer while maintaining interconnectedness among the embedded chips.

State-of-the-art Chip embedding technology has become a necessity in the fabrication of complex electronics. With emphasis on IoT (internet of things), new applications with embedded sensors, driven by miniaturization and optimized packages for the different demands for the sensors—became urgent; as did an increase of complexity by embedding of chips with large number of interconnections and more.

The development of such complex electronics requires research, development and engineering of a substantial number of prototypes of printed circuit boards (PCBs), each requiring quality assurance tests, fault tolerance tests, efficiency tests and more, prior to being transferred to mass production. Each PCB further requires planning processes, fabrication, purchasing and assembly, with the fabrication process being typically, the most substantial bottleneck for the process in terms of time and costs. Not insubstantial as well, is the risk of exposing trade secrets. These risks are currently inevitable, since the costs associated with faulty design and malfunctions during the mass production stage are order(s) of magnitude higher, both in terms of costs, as well as in damage to reputation.

The present disclosure is directed toward overcoming one or more of the above-identified problems.

SUMMARY

Disclosed, in various embodiments, are systems, methods and compositions for the direct and continuous inkjet printing of printed circuit boards (PCBs) with embedded chip and/or chip packages using a combination of print heads with conductive and dielectric ink compositions, creating predetermined slots for locating the chips and/or chip packages and covering these with an encapsulating layer while maintaining interconnectedness among the embedded chips.

In an embodiment provided herein is a method for embedding a plurality of chips in a printed circuit board using inkjet printer comprising: providing an ink jet printing system having: a first print head having: at least one aperture, a insulating and/or dielectric resin ink reservoir, and a insulating and/or dielectric resin pump configured to supply insulating and/or dielectric resin inkjet ink through the aperture; a second print head having: at least one aperture, a conductive ink reservoir, and a conductive ink pump configured to supply the conductive ink through the aperture; a conveyor, operably coupled to the first second print heads configured to convey a substrate to each of the first and second print heads; and a computer aided manufacturing ("CAM") module, comprising: a data processor; a non-volatile memory; and a set of executable instructions stored on the non-volatile memory for: receiving a 3D visualization file representing the printed circuit board including the embedded plurality of chips; generating a file that represents at least one, substantially 2D layer for printing the printed circuit board including the embedded plurality of chips, wherein the file representing the at least one, substantially 2D layer does not include a representation of any of the plurality of chips, creating a substantially 2D representation image of the substantially 2D layer without the chips; receiving a selection of parameters related to the printed circuit board including the embedded plurality of chips; and altering the file represents at least one, substantially 2D layer based on at least one of the selection of parameters, wherein the CAM module is configured to control each of the print heads; providing the insulating and/or dielectric resin inkjet ink composition and the conductive ink composition; using the CAM module, obtaining a generated file representing a first, substantially 2D layer of the printed circuit board including the embedded plurality of chips for printing, the 2D layer comprising a pattern representative of the insulating and/or dielectric resin inkjet ink, the conductive ink, wherein the pattern does not include any of the plurality of chips, or a combination comprising two or more; using the first print head, forming the pattern corresponding to the insulating and/or dielectric resin representation in the first, substantially 2D layer of the printed circuit board not including the embedded plurality of chips for printing; curing the pattern corresponding to the insulating and/or dielectric resin representation in the 2D layer of the printed circuit board not including the embedded plurality of chips, the pattern defining a designated area for each of the plurality of chips, resistors, capacitors and any other associated component, wherein the chips; placing at least two chips in a designated area on the first, substantially 2D layer of printed circuit board not including the embedded plurality of chips, wherein the chips are placed with a contact layer being on top; using the second print head, forming the pattern corresponding to the conductive ink representation in the first, substantially 2D layer of printed circuit board including the embedded plurality of chips for printing; sintering the pattern corresponding to the conductive ink representation in the first, substantially 2D layer of printed circuit board including the embedded plurality of chips for printing; using the CAM module, obtaining a generated file representing a substantially 2D layer of the printed circuit board including the embedded plurality of chips for printing, the 2D layer comprising a pattern representative of the insulating and/or dielectric resin inkjet ink wherein the pattern is configured to embed the plurality of chips within the printed circuit board; using the first print head, forming the pattern corresponding to the insulating and/or dielectric resin representation in the substantially 2D layer of the printed circuit board including the embedded plurality of chips configured to embed the plurality of chips within the printed circuit board; and curing the pattern corresponding to the insulating and/or dielectric resin representation thereby embedding the plurality of chips.

In another embodiment, the insulating and/or dielectric resin ink can be a mixture of photopolymerizable monomers, oligomers or their combination, a colloidal dispersion of high-molecular weight polymers, a polymer solution or a combination thereof, in a dedicated print head having either a single insulating and/or dielectric resin ink composition, or with a dedicated additional print head with a separate insulating and/or dielectric resin ink that is different or the same as the first insulating and/or dielectric resin ink.

In an embodiment, the conducting ink can be a dispersion of metallic nanoparticles in solvent or a metallic precursor solution or dispersion or a combination thereof.

In yet another embodiment, the inkjet printing system further comprises an additional print head having: at least one aperture, a second insulating and/or dielectric resin ink reservoir, and a second insulating and/or dielectric resin ink pump configured to supply the second insulating and/or dielectric resin ink through the aperture, the method further comprising: providing a second insulating and/or dielectric resin ink composition; using the second insulating and/or dielectric resin ink print head, forming a predetermined pattern corresponding to the second insulating and/or dielectric resin ink representation in the first, substantially 2D layer of the printed circuit board not including the plurality of embedded chips for printing; and curing or the predetermined pattern corresponding to the second insulating and/or dielectric resin representation in the 2D layer of the circuit board not including the embedded plurality of chips, wherein the second insulating and/or dielectric resin ink composition has a different ink composition than the insulating and/or dielectric resin ink composition in the first print head.

These and other features of the systems, methods and compositions for using inkjet printing for fabricating printed circuit boards with embedded integrated chips, will become apparent from the following detailed description when read in conjunction with the figures and examples, which are exemplary, not limiting.

BRIEF DESCRIPTION OF THE FIGURES

For a better understanding of the direct inkjet printing of printed circuit board with embedded chip and/or chip packages fabrication methods and compositions, with regard to the embodiments thereof, reference is made to the accompanying examples and figures, in which.

DETAILED DESCRIPTION

Provided herein are embodiments of systems methods and compositions for the direct inkjet printing of printed circuit board with embedded chip and/or chip packages using a combination of print heads with conductive and dielectric ink compositions, creating predetermined slots for locating the chips and/or chip packages and covering these with an encapsulating layer while maintaining interconnectedness among the embedded chips.

Technologies for the embedding of active and passive components into multilayered PCBs have become a necessity for the development of complex electronics. Different embedding technologies have been developed due to different requirements with respect to electrical performance, chip dimensions, and interconnection.

Figure 1:
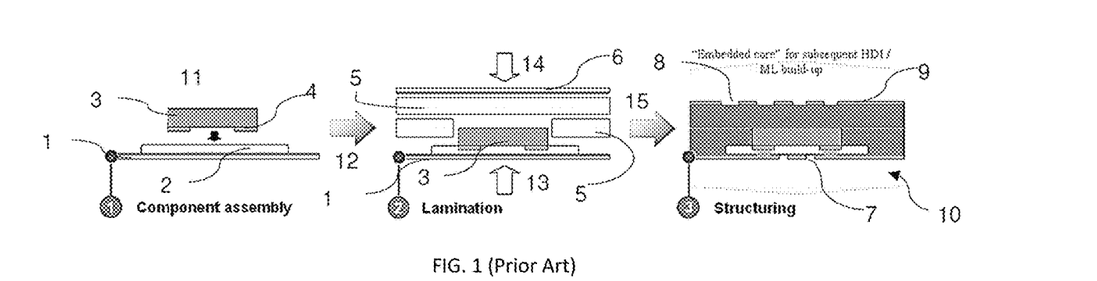
FIG. 1, illustrates typical methodology of embedding chips in a PCB.

For example and as illustrated in FIG. 1, a typical methodology would involve wafer preparation 1, whereby since laser drilling of microvias and the PCB metallization process is not compatible with aluminum or copper contact pads of semiconductor chips, a further layer of copper 2 is applied to the bond pads 4 of the chips to be embedded. Other metallization such as electroless plating (using e.g., Ni, Pd) were optimized for microvia drilling and plating. Passivation layers can then be tested for their fragility as well as for their adhesion with the laminate layers. Next comes die placement 11 whereby a substrate 1 for receiving the chip 3 is made. Chip bonding is done by various methods, for example printable pastes, die attach films (DAF), die dicing attach films (DDAF), and the like.

Following die bonding, typically a dielectric film material (e.g., resin-coated copper RCC 5) is laminated 12 on the substrate 1 followed 15 by microvia 7, 8, formation (and subsequent metallization) leading to the circuit patterning. The patterning can be done using a laser direct imaging (LDI) of photo resist followed by an acidic spray etching. The process is typically concluded by separating the PCB including the embedded component.

Conversely, the systems, methods and compositions described herein can be used to form/fabricate the printed circuit boards including embedded chip components (ECPCBs), using a combination of print heads with conductive and dielectric ink compositions in a continuous additive manufacturing process using the inkjet printing device, or using several passes. Using the systems, methods and compositions described herein, a thermoset resin material can be used to form the insulating and/or dielectric portion of the printed circuit boards (see e.g., FIG. 2A). This printed dielectric material is printed in optimized shape including accurate compartments shaped to accommodate embedded chip components as well as other components, for example resistor(s), transistor(s), capacitor(s), sensor(s), via (s) or a combination comprising the foregoing. Those chip components placed inside their corresponding components laying on their "back" revealing (in other words, upside down exposing) their legs (or bond pads), for a layer of conductive ink that can be printed in order to interconnect those component to each other and to other components (e.g., resistors). To form embedded chip component, the system covers with printed dielectric layer filling compartments and cover the embedded components, traces, legs forming embedded PCB. Using the systems, methods and compositions described herein, the typical time consuming and cost intensive fabrication and assembly and soldering the components can be eliminated providing better control over complex geometries and rapid prototyping as well as mass production of printed circuit boards including embedded chip (and other) components can be achieved.

The systems used can typically comprise several sub-systems and modules. These can be, for example: a mechanical sub-system to control the movement of the print heads, the substrate (or chuck) its heating and conveyor motions; the ink composition injection systems; the curing/sintering sub-systems; a computer based sub-system that controls the process and generates the appropriate printing instructions; a component placement system; machine vision system; and a command and control system to control the 3D printing.

Accordingly and in an embodiment, provided herein is a method for embedding a plurality of chips in a printed circuit board using inkjet printer comprising: providing an ink jet printing system having: a first print head having: at least one aperture, a insulating and/or dielectric resin ink reservoir, and a insulating and/or dielectric resin pump configured to supply insulating and/or dielectric resin inkjet ink through the aperture; a second print head having: at least one aperture, a conductive ink reservoir, and a conductive ink pump configured to supply the conductive ink through the aperture; a conveyor, operably coupled to the first and second print heads configured to convey a substrate to each of the first and second print heads; and a computer aided manufacturing ("CAM") module, comprising: a data processor; a non-volatile memory; and a set of executable instructions stored on the non-volatile memory for: receiving a 3D visualization file representing the printed circuit board including the embedded plurality of chips; generating a file that represents at least one, substantially 2D layer for printing the printed circuit board including the embedded plurality of chips, wherein the file representing the at least one, substantially 2D layer does not include a representation of any of the plurality of chips, creating a substantially 2D representation image of the substantially 2D layer without the chips; receiving a selection of parameters related to the printed circuit board including the embedded plurality of chips; and altering the file represents at least one, substantially 2D layer based on at least one of the selection of parameters, wherein the CAM module is configured to control each of the print heads; providing the insulating and/or dielectric resin inkjet ink composition and the conductive ink composition; using the CAM module, obtaining a generated file representing a first, substantially 2D layer of the printed circuit board including the embedded plurality of chips for printing, the 2D layer comprising a pattern representative of the insulating and/or dielectric resin inkjet ink, the conductive ink, wherein the pattern does not include any of the plurality of chips, or a combination comprising two or more; using the first print head, forming the pattern corresponding to the insulating and/or dielectric resin representation in the first, substantially 2D layer of the printed circuit board not including the embedded plurality of chips for printing; curing the pattern corresponding to the insulating and/or dielectric resin representation in the 2D layer of the printed circuit board not including the embedded plurality of chips, the pattern defining a designated area for each of the plurality of chips, resistors, capacitors and any other associated component, wherein the chips; placing at least two chips in a designated area on the first, substantially 2D layer of printed circuit board not including the embedded plurality of chips, wherein the chips are placed with a contact layer being on top; using the second print head, forming the pattern corresponding to the conductive ink representation in the first, substantially 2D layer of printed circuit board including the embedded plurality of chips for printing; sintering the pattern corresponding to the conductive ink representation in the first, substantially 2D layer of printed circuit board including the embedded plurality of chips for printing; using the CAM module, obtaining a generated file representing a substantially 2D layer of the printed circuit board including the embedded plurality of chips for printing, the 2D layer comprising a pattern representative of the insulating and/or dielectric resin inkjet ink wherein the pattern is configured to embed the plurality of chips within the printed circuit board; using the first print head, forming the pattern corresponding to the insulating and/or dielectric resin representation in the substantially 2D layer of the printed circuit board including the embedded plurality of chips configured to embed the plurality of chips within the printed circuit board; and curing the pattern corresponding to the insulating and/or dielectric resin representation thereby embedding the plurality of chips.

The term "chip" refers to a packaged, singulated, IC device. The term "chip package" may particularly denote a housing that chips come in for plugging into (socket mount) or soldering onto (surface mount) a circuit board such as a printed circuit board (PCB), thus creating a mounting for a chip. In electronics, the term chip package or chip carrier may denote the material added around a component or integrated circuit to allow it to be handled without damage and incorporated into a circuit.

Alternatively, or additionally, the inkjet printing system used in the methods and compositions for fabricating printed circuit boards including embedded chip components, can further comprise comprises an additional print head having: at least one aperture, a second insulating and/or dielectric resin ink reservoir, and a second insulating and/or dielectric resin ink pump configured to supply the second insulating and/or dielectric resin ink through the aperture, with the method further comprising: providing a second insulating and/or dielectric resin ink composition; using the second insulating and/or dielectric resin ink print head, forming a predetermined pattern corresponding to the second insulating and/or dielectric resin ink representation in the first, substantially 2D layer of the printed circuit board not including the plurality of embedded chips for printing; and curing or the predetermined pattern corresponding to the second insulating and/or dielectric resin representation in the 2D layer of the circuit board not including the embedded plurality of chips, wherein the second insulating and/or dielectric resin ink composition has a different ink composition than the insulating and/or dielectric resin ink composition in the first print head. In an embodiment, the second dielectric resin ink is configured to form a mold frame on a chip.

Furthermore, the methods of forming the printed circuit boards including embedded chip components described herein can further comprise a step of providing a peelable, or removable substrate, prior to the step of using the first print head, and/or the second print head. The optional peelable substrate can also be either rigid or flexible. The term "peelable" refers in an embodiment to materials that can be removably applied to and adhere to surfaces such as the surface created by the method, compositions and kits for forming printed circuit boards including embedded chip components described herein and can be subsequently removed from that surface by force. Peelable films according to the compositions and methods of this invention can be adhesively and removably applied to a chuck disposed on the printer's conveyor belt and, by virtue of being forcibly removed, expose a layer of the printed circuit boards including embedded chip components described herein.

The removable substrate can also be a powder, for example, a ceramic powder, which can be applied to the chuck, compacted and later removed. The choice of substrate can depend, for example on the final printed circuit boards including embedded chip components' use and structure. Furthermore, the removal of the substrate can take place at the end of the fabrication of the whole component, the fabrication of the first 2D layer, or at any stage in between.

The method of forming the printed circuit boards including embedded chip components described herein can, as described above, comprise the step of providing a substrate.

The print head (and derivatives thereof; are to be understood to refer to any device or technique that deposits, transfers or creates material on a surface in a controlled manner) depositing the resin and/or metallic ink can be configured to provide the ink droplet(s) upon demand, in other words, as a function of various preselected process parameters such as conveyor speed, desired flexible conductive layer thickness and/or length, layer type, layer flexibility required (in other words, how far should the component bend relative to the initial 2D configuration) and the like. The removable or peelable substrate can also be a relatively rigid material, for example, glass or crystal (e.g., sapphire). Additionally, or alternatively, the peelable substrate may be a flexible (e.g., rollable) substrate (or film) to allow for an easy peeling of the substrate from the printed circuit boards including embedded chip components, for example, poly(ethylenenaphthalate) (PEN), polyimide (e.g. KAPTONE® by DuPont), silicon polymers, poly(ethyleneterphtalate) (PET, bopth cPET or aPET), poly(tetrafluoroethylene) (PTFE) films etc. Moreover, the substrate can be, for example a ceramic powder.

In fabricating or forming the printed circuit boards including embedded chip components articles and components described herein, by depositing substantially 2D layers of a insulating and/or dielectric resin and/or conductive materials, supporting layers or structures can be deposited as part of the substantial 2D representation of the printed circuit boards including or those 2D representation not including embedded chip components described herein. This support can be removable and be positioned underneath subsequently printed overhanging portions or in prospective cavities, which are not supported by the part or component material itself. For example, support can be deposited in compartments fabricated to house the chips before their placement in subsequent steps, without affecting the die pads. A support structure may be built utilizing the same deposition techniques by which the dielectric or conductive material is deposited. In an embodiment, the CAM module can generate additional geometry acting as a support structure for the overhanging or free-space segments, or internal chip compartment of the 3D visualization file representing the ECPCB formed, and in other circumstances, for the sidewalls of the printed circuit boards including embedded chip components described herein. The support material can be configured to, for example, adhere to the part material during fabrication, and be removable from the completed printed circuit boards including embedded chip components and components described herein when the printing process is completed.

Figure 2A:
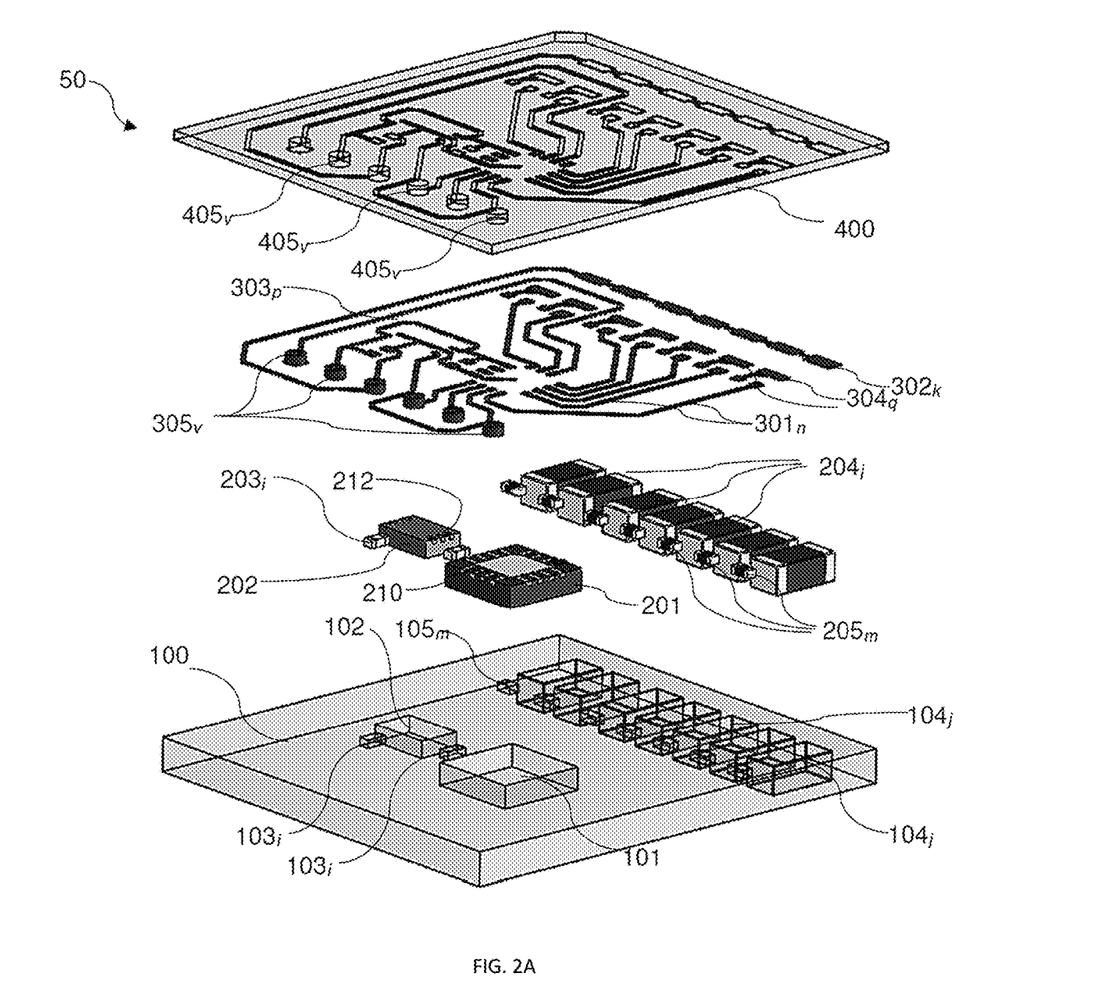
FIG. 2A is a schematic illustrating an embodiment of the method of forming a PCB with embedded components, where

For example, the systems and compositions utilized in the methods described, can be used to form the printed circuit boards with the predetermined compartments for placing the chip components or packages described, whereby, following placement of the proper chip component in the corresponding compartment, support material is deposited into the compartment, encasing the chip component and the PCB is removed for further processing before the sealing and embedding of the chip component (see e.g., FIG. 2A).

The term "support" as used herein refers to one or more layers of a support material used to provide structural support to the plurality of layers of built printed circuit boards with and/or without the embedded chips therein, during the fabrication of the printed circuit boards including embedded chip components described herein. For example, the support material can be a wax including at least one functional group capable of reacting with the insulating and/or dielectric resin ink composition, when exposed to the actinic radiation used for curing of the insulating and/or dielectric resin ink composition. In some embodiments, the functional group in the wax is capable of reacting with the build material in the presence of a photoinitiator typically used for curing of the build material, and subsequent formation of the 3D article and later melted under mild heating and removed. Additional support materials can be, for example, non cross-linked, solvent/water soluble material, which allows support structures to be relatively easily washed away—once the print process is complete. Alternatively or additionally, breakaway support materials can also be possible, which can be removed by manually snapping them off the part.

In other embodiments, the support material used in the methods and systems for fabricating printed circuit boards including embedded chip components and components described herein can be transparent to actinic radiation to accommodate exposure through the support. In an embodiment, "actinic radiation" refers to an energy beam capable of curing a resin ink composition such as any electromagnetic irradiation, e.g., infrared, ultraviolet ray, electron beam, X-ray or radial ray. Accordingly, the term "actinic radiation-curable resin composition" to be used in producing the printed circuit boards including embedded chip components described herein and components described herein, can be a resin composition which is cured upon irradiation with one or more actinic radiations (energy beams) as described above.

Such irradiation results in curing at least a part of the photopolymerizable insulating and/or dielectric resin ink composition in the layers nearest to the support. Examples of suitable support materials include polymeric films such as those formed by addition polymers and linear condensation polymers and transparent foams. Polymeric supports for use in the methods described herein, can be cellulose acetate propionate, cellulose acetate butyrate, polyesters such as polyethylene terephthalate (PET) and polyethylene naphthalate (PEN); oriented polystyrene (OPS); oriented nylon (ONy); polypropylene (PP), oriented polypropylene (OPP); polyvinyl chloride (PVC); and various polyamides, polycarbonates, polyimides, polyolefins, poly(vinylacetals), polyethers and polysulfonamides, and opaque white polyesters. Acrylic resins, phenol resins, glass and metals may also be used as an ink-receiver.

Accordingly and in an embodiment, the inkjet printing system used in the methods and systems for fabricating printed circuit boards including embedded chip components and components can further comprise additional print head having: at least one aperture, a support ink reservoir, and a support ink pump configured to supply the support ink through the aperture, the method further comprising: providing a support ink composition; before, simultaneously with, or subsequent to the step of using the first print head and/or the second print head, using the support ink print head, forming a predetermined pattern corresponding to the support representation in the first, substantially 2D layer of the printed circuit boards including (or not including) embedded chip components for printing; and functionalizing the predetermined pattern corresponding to the support representation in the 2D layer of the printed circuit boards including (or not including) the embedded chip components.

The term "forming" (and its variants "formed", etc.) refers in an embodiment to pumping, injecting, pouring, releasing, displacing, spotting, circulating, or otherwise placing a fluid or material (e.g., the conducting ink) in contact with another material (e.g., the substrate, the resin or another layer) using any suitable manner known in the art.

Likewise, the term "embedded" refers to the chip and/or chip package being coupled firmly coupled within a surrounding structure, or enclosed snugly or firmly within a material or structure.

Furthermore, the chip or chip package used in conjunction with the systems, methods and compositions described herein can be Quad Flat Pack (QFP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Ball-Grid Array (BGA), a Quad Flat No-Lead (QFN) package, a Land Grid Array (LGA) package, a passive component, or a combination comprising two or more of the foregoing.

Curing the insulating and/or dielectric resin layer or pattern deposited by the appropriate print head as described herein, can be achieved by, for example, heating, photopolymerizing, drying, depositing plasma, annealing, facilitating redox reaction, irradiation by ultraviolet beam or a combination comprising one or more of the foregoing. Curing does not need to be carried out with a single process and can involve several processes either simultaneously or sequentially, (e.g., drying and heating and depositing crosslinking agent with an additional print head)

Furthermore, and in another embodiment, crosslinking refers to joining moieties together by covalent bonding using a crosslinking agent, i.e., forming a linking group, or by the radical polymerization of monomers such as, but not limited to methacrylates, methacrylamides, acrylates, or acrylamides. In some embodiment, the linking groups are grown to the end of the polymer arms. In preferred embodiments, siloxane-polymers conjugates have alkenyl groups and are crosslinked by radical polymerization the absence or presence of other molecules that contain alkenyl groups, such as, but not limited to, methacrylates, methacrylamides, acrylates, or acrylamides and crosslinkers and radical, anionic, cationic initiators.

In an embodiment, the term "copolymer" means a polymer derived from two or more monomers (including terpolymers, tetrapolymers, etc.), and the term "polymer" refers to any carbon-containing compound having repeat units from one or more different monomers.

Likewise, other functional heads may be located before, between or after the insulating and/or dielectric resin print head and/or the conducting print head(s). These may include a source of electromagnetic radiation configured to emit electromagnetic radiation at a predetermined wavelength ($\lambda$), for example, between 190 nm and about 400 nm, e.g. 395 nm which in an embodiment, can be used to accelerate and/or modulate and/or facilitate a photopolymerizable insulating and/or dielectric resin that can be used in conjunction with metal nanoparticles dispersion used in the conductive ink. Other functional heads can be heating elements, additional printing heads with various inks (e.g., support, pre-soldering connective ink, label printing of various components for example capacitors, transistors and the like) and a combination of the foregoing.

As indicated, the systems used to implement the methods for fabricating printed circuit boards including embedded chip components and their packaged components can have additional conducting ink print heads, which may contain different metals. For example, the second print head as described herein can comprise a Silver (Ag) nanoparticles while an additional print head for metallic ink may comprise different metal, e.g., Copper, or Gold. Likewise, other metals (e.g., Al) or metal precursors can also be used and the examples provided should not be considered as limiting.

Accordingly, the inkjet printing system further comprises an additional print head having: at least one aperture, a second conductive ink reservoir, and a second conductive ink pump configured to supply the second conductive ink through the aperture, the method further comprising: providing a second conductive ink composition; using the second conductive ink print head, forming a predetermined pattern corresponding to the second conductive ink representation in the first, substantially 2D layer of the printed circuit board not including the plurality of embedded chips for printing; and sintering, the predetermined pattern corresponding to the second conductive ink representation in the 2D layer of the circuit board not including the plurality of embedded chips, wherein the second conductive ink composition has a different metal than the conductive ink composition in the second print head. The second metallic ink composition can have a different metal than the conducting ink composition in the second print head, or in another embodiment; and in order to achieve higher throughput, the second metallic ink composition can be identical in all metallic print heads. For example, the first conductive ink composition can comprise silver and the second conductive ink composition can comprise copper (or gold), and wherein the second conductive ink is configured to be used form a bond between a placed chip and a metallic trace leading to the chip. In another embodiment, the second conductive ink can be used to metalize vias, for example buried or blind vias.

In addition, all printing heads and the method of forming the printed circuit boards including embedded chip components described herein, can be configured to take place in a housing having controlled atmosphere therein. Likewise, the controlled atmosphere can be affected by the insulating and/or dielectric ink and the conducting ink compositions.

Other similar functional steps (and therefore means for affecting these steps) may be taken before or after each of the insulating and/or dielectric resin ink or metallic conducting ink print heads (e.g., for sintering the conducting layer). These steps may include (but not limited to): a heating step (affected by a heating element, or hot air); photobleaching (of a photoresist mask support pattern), photocuring, or exposure to any other appropriate actininc radiation source (using e.g., a UV light source); drying (e.g., using vacuum region, or heating element); (reactive) plasma deposition (e.g., using pressurized plasma gun and a plasma beam controller); cross linking such as by using cationic initiator e.g. [4-[(2-hydroxytetradecyl)-oxyl]-phenyl]-phenyliodonium hexafluoro antimonate to a flexible resin polymer solutions or flexible conductive resin solutions; prior to coating; annealing, or facilitating redox reactions and their combination regardless of the order in which these processes are utilized. In certain embodiment, a laser (for example, selective laser sintering/melting, direct laser sintering/melting), or electron-beam melting can be used on the rigid resin, and/or the flexible portion. It should be noted, that sintering of the conducting portions can take place even under circumstances whereby the conducting portions are printed on top of a rigid resinous portion of the printed circuit boards including embedded chip components described herein component.

In certain embodiments, the systems provided herein further comprise a robotic arm in communication with the CAM module and under the control of the CAM module, configured to place each of the plurality of chips in its predetermined location. The robotic arm can be further configured to operatively couple and connect the chip to the integrally printed die pad.

As indicated, the chip embedded in the PCBs disclosed can be BGA chip packages, typically comprising a substrate, such as a PCB, having an elongated aperture extending through the middle thereof. A semiconductor die or device, (e.g., a dynamic random access memory (DRAM)), can be mounted on the opposite or bottom side of the substrate, which often will have a plurality of bond pads in single column or multiple columns on an active surface of the semiconductor die. Circuit traces located on or within the substrate (PCB) serve to maintain electric communication between the bond pads and respective electrically conductive, connective elements such as solder balls. The electrically conductive elements typically comprise solder balls in electrical communication with and attached to a contact pad, or can merely be a solder ball placed directly upon, or in electrical communication with, the termination point of a selected circuit trace. Alternatively, conductive balls made of a conductive-filled epoxy material having specifically preselected conductive qualities are also frequently used. The conductive elements or balls are arranged in a grid array pattern wherein the conductive elements or solder balls are of a preselected size or sizes and are spaced from each other at one or more preselected distances, or pitches. Hence, the term "fine ball grid array" (FBGA) merely refers to a particular ball grid array pattern having what are considered to be relatively small conductive elements or solder balls being spaced at very small distances from each other resulting in dimensionally small spacings or pitch. As generally used herein, the term "ball grid array" (BGA) encompasses fine ball grid arrays (FBGA) as well as ball grid arrays. Accordingly and in an embodiment, the pattern representative of the conductive ink printed using the methods described herein, is configured to fabricate interconnect (in other words, solder) balls.

It should be noted, that, in the insulating and/or dielectric portion of the printed circuit boards including embedded chip components described herein; conducting layers can be (simultaneously and directly) deposited among the insulating and/or dielectric resin layers, separately and distinct from a coating pattern above the insulating and/or dielectric resin layer. For example, a conducting layer can be deposited over a support layer, which following removal, will be independent of any resin material (see e.g., $304_q$, FIG. 2A).

Accordingly, in an embodiment, the steps of using the second print head and depositing the conducting ink onto a substrate, or if so required, onto a chuck, thereby forming a first printed conducting (conductive) pattern layer and/or the step of depositing the insulating and/or dielectric rigid resin-containing inkjet ink onto the removable substrate (or chuck), and/or or removable support, is preceded, followed or takes place concurrently with a step of heating, photo-curing drying, depositing plasma, cross linking, annealing, facilitating redox reactions, sintering, melting or a combination of steps comprising one or more of the foregoing. The pre-, or post portion treatment (in other words, functionalizing the insulating and/or dielectric rigid resin and/or conducting and/or optional support portions) can take place either before or after the step of using the additional insulating and/or dielectric resin ink print head(s), the additional conducting ink print head(s) or in any other permutation.

Formulating the conducting ink composition may take into account the requirements, if any, imposed by the deposition tool (e.g., in terms of viscosity and surface tension of the composition) and the deposition surface characteristics (e.g., hydrophilic or hydrophobic, and the interfacial energy of the peelable or removable substrate or the support material, if used), or the substrate layer on which consecutive layers are deposited. Using ink-jet printing with a piezo head, the viscosity of either the conducting ink and/or the resin-forming inkjet ink (measured at the printing temperature ° C.) can be, for example, not lower than about 5 cP, e.g., not lower than about 8 cP, or not lower than about 10 cP, and not higher than about 30 cP, e.g., not higher than about 20 cP, or not higher than about 15 cP. The conducting ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

Using a metallic composition in the methods of fabricating printed circuit boards including embedded chip components as described herein, can be composed essentially of solvent-suspended metallic copper, silver, aluminum nanoparticles, or metallic inkjet ink compositions comprising one or more of the foregoing and other metals (e.g., Group IA (1) of the periodic table), a binder, and a solvent, wherein the diameter, shape and composition ratio of the nanoparticles in the ink are optimized, thus enabling the formation of a layer, or dense printed pattern. It should be noted that choice of metal ink will depend on the final characteristics of the 3D printed circuit boards including embedded chip components sought to be printed. These particles can be in a size range suitable for the desired applications. In an embodiment, conducting portion patterns formed using silver are printed using inks of nanosilver suspensions. The conducting portion of the 2D representation of the printed circuit boards including embedded chip components described herein can be significantly enhanced in quality during sintering by, for example, the silver nanoparticles having thin or small features with high aspect ratios (e.g., flakes or rods). In other words, by having metallic nanoparticles with aspect ratio R is much higher than 1 (R>>1). Having the high aspect ratio can create an alignment of the nanoparticles due to, for example, flow orientation of the ink in the direction of motion of the substrate on a chuck, or in another embodiment, by the ejection process from the print head's orifice.

In an embodiment, the term "chuck" is intended to mean a mechanism for supporting, holding, or retaining a substrate or a workpiece. The chuck may include one or more pieces. In one embodiment, the chuck may include a combination of a stage and an insert, a platform, be jacketed or otherwise be configured for heating and/or cooling and have another similar component, or any combination thereof.

In an embodiment, the ink-jet ink compositions, systems and methods allowing for a direct, continuous or semi-continuous ink-jet printing of a printed circuit boards including embedded chip components can be patterned by expelling droplets of the liquid ink-jet ink provided herein from an orifice one-at-a-time, as the print-head (or the substrate) is maneuvered, for example in two (X-Y) (it should be understood that the print head can also move in the Z axis) dimensions at a predetermined distance above the removable substrate or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an embodiment, from within a well operably coupled to the orifice. The printing of the first inkjet metallic ink can be additive and can accommodate a greater number of layers. The ink-jet print heads provided used in the methods described herein can provide a minimum layer film thickness equal to or less than about 0.3 µm-10,000 µm Similarly, the term "contacting" is used in an embodiment to refer to materials which may be blended, mixed, slurried, dissolved, reacted, treated, or otherwise contacted in some other manner. Therefore, the term "contacting" encompasses the "reacting" of two or more components, and it also encompasses the "mixing" or "blending" of two or more components that do not react with one another.

The conveyor maneuvering among the various print heads used in the methods described and implementable in the systems described can be configured to move at a velocity of between about 5 mm/sec and about 1000 mm/sec. The velocity of the e.g., chuck can depend, for example, on: the desired throughput, the number of print heads used in the process, the number and thickness of layers of the printed circuit boards including embedded chip components described herein printed, the curing time of the ink, the evaporation rate of the ink solvents, the distance between the print head(s) containing the first ink-jet conducting ink of the metal particles or metallic polymer paste and the second print head comprising the second, thermoset resin and board forming inkjet ink, and the like or a combination of factors comprising one or more of the foregoing.

In an embodiment, the dynamic viscosity of the various inks can each be between about 0.1 and about 30 cP·s (mPa·s), for example the final ink formulation can have a viscosity of 8-12 cP·s at the working temperature, which can be controlled. For example, the metallic nanoparticles dispersion, solution, emulsion, suspension, or liquid composition comprising the foregoing, or the resin inkjet ink can each be between about 5 cP·s and about 25 cP·s, or between about 7 cP·s and about 20 cP·s, specifically, between about 8 cP·s and about 15 cP·s.

In an embodiment, the volume of each droplet of the metallic (or metallic) ink, and/or the second, resin ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 2 kHz and about 500 kHz.

The insulating and/or dielectric resin inks can be configured to be stable within a print head reservoir. For example, the solid contents (i.e., suspended solids if colloidal suspension, or solute if a solution) can be between about 5 wt % and about 100 wt %. In certain embodiments, surfactants may not be necessary and the ink can be 100% active, by incorporating photoactive monomers/oligomers and their combination, in which no appreciable sedimentation can take place. Further, the ink viscosity can be adjusted to facilitate ejection of droplets. Accordingly, in an embodiment, the surface energy (γ) together with dynamic viscosity (µ) of the resin ink solutions used in the methods of forming the printed circuit boards including embedded chip components described herein can be in the range of between about 25 mN/m and about 35 mN/m and between about 8 mNs/m$^2$ (cP) and about 15 mNs/m$^2$ (cP), respectively. Inks used in certain embodiments, which are comprised of suspended sub-micron particles, for example in the printed circuit boards including embedded chip the dielectric inks and metallic particles inks, as well as, in some embodiments, the resin inks can be configured to facilitate optimal operation as determined by some thresholds (e.g., nozzle orifice and nozzle neck) inside micro liquid channels of the print head(s).

In an embodiment, the cross-linking agent, co-monomer, co-oligomer, co-polymer or a composition comprising one or more of the foregoing and is used in the insulating and/or dielectric ink, and/or the conducting ink compositions provided, can be a part, or configured to form a solution, emulsion, or suspension within the resinous ink compositions.

The printed pattern of the insulating and/or dielectric and/or conducting resin ink(s) portion can be fabricated from resin-rich ink compositions, for example, suspensions, emulsions, solutions and the like. The term "resin-rich" refers to compositions in which larger proportions of polymer resin components are included than are needed to bind the pigment particles to each other and the resin layer to the underlying substrate, or another printed circuit boards including embedded chip components layer, or support portion and their combination. For example, a resin-rich component layer may include polymer resins in amounts that are at least 95% by weight of the total resin ink weight.

As described, the parameters used in the step of selection of parameters related to the Printed circuit boards including embedded chip components performed by the CAM module used for the its fabrication, can be, for example: the parameters used in the selection of parameters related to the printed circuit boards including embedded chip components are; the insulating and/or dielectric resin ink pattern in the layer, the conductive ink pattern in the layer, curing requirements for the insulating and/or dielectric resin, sintering for the conductive ink pattern in the layer, location and/or type of each chip, throughput requirement, or a combination of parameters comprising one or more of the foregoing.

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices.

The CAM module can comprise: a 2D file library storing the files converted from the 3D visualization files of the printed circuit boards including embedded chip components; a processor in communication with the library; a memory device storing a set of operational instructions for execution by the processor; a micromechanical inkjet print head or heads in communication with the processor and with the library; and a print head (or, heads') interface circuit in communication with the 2D file library, the memory and the micromechanical inkjet print head or heads, the 2D file library configured to provide printer operation parameters specific to a functional layer; pre-processing Computer-Aided Design/Computer-Aided Manufacturing (CAD/CAM) generated information associated with the 3D printed circuit boards including embedded chip components to be fabricated, thereby obtaining a plurality of 2D file; loading the plurality of 2D file(s) processed in the step of pre-processing from the printed circuit boards including embedded chip components 3D visualization files onto the 2D file library; and using the 2D file library, instructing the processor to print the predetermined layer of the printed circuit boards including embedded chip components in a predetermined order.

The 3D visualization file representing the printed circuit boards including embedded chip components used for the fabrication of the printed circuit boards including embedded chip components described herein, can be: an an ODB, an ODB++, an .asm, an STL, an IGES, a STEP, a Catia, a SolidWorks, a Autocad, a ProE, a 3D Studio, a Gerber, a Rhino a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

In certain embodiments, the CAM module further comprises a computer program product for fabricating one or more printed circuit boards including embedded chip components, for example, an electronic component, machine part, a connector and the like. The printed component can comprise both discrete metallic (conductive) components and resinous (insulating and/or dielectric) components that are each and both being printed optionally simultaneously or sequentially and continuously, on either a rigid portion or a flexible portion of the PCB and/or FPC. The term "continuous" and its variants are intended to mean printing in a substantially unbroken process. In another embodiment, continuous refers to a layer, member, or structure in which no significant breaks in the layer, member, or structure lie along its length.

The computer controlling the printing process described herein can comprise: a computer readable storage medium having computer readable program code embodied therewith, the computer readable program code when executed by a processor in a digital computing device causes a three-dimensional inkjet printing unit to perform the steps of: pre-processing Computer-Aided Design/Computer-Aided Manufacturing (CAD/CAM) generated information associated with the printed circuit boards including embedded chip components described herein (in other words, the 3D visualization file representing the printed circuit boards including embedded chip components) to be fabricated, thereby obtaining a plurality of 2D files (in other words, the file that represents at least one, substantially 2D layer for printing the printed circuit boards that does and/or does not including embedded chip components as well as compartment designation for other components), each 2D file specific for a predetermined layer in a specific order; loading the plurality of 2D file s processed in the step of pre-processing onto a 2D file library; directing a stream of droplets of a metallic material from a first inkjet print head of the three-dimensional inkjet printing unit at a surface of a substrate; directing a stream of droplets of a insulating and/or dielectric resin material from a first inkjet print head of the three-dimensional (3D) inkjet printing unit at the surface of the substrate; alternatively or additionally directing a stream of droplets material from another inkjet print head of the three-dimensional inkjet printing unit at a surface of the metallic pattern and/or the resin pattern; moving the inkjet heads relative to the substrate in an x-y plane of the substrate, wherein the step of moving the inkjet heads relative to the substrate in the x-y plane of the substrate, for each of a plurality of layers is performed in a layer-by-layer fabrication of the printed circuit boards including embedded chip components described herein on the substrate.

In addition, the computer program, can comprise program code means for carrying out the steps of the methods described herein, as well as a computer program product comprising program code means stored on a medium that can be read by a computer, such as a floppy disk, a hard disk, CD-ROM, DVD, USB memory stick, or a storage medium that can be accessed via a data network, such as the Internet or Intranet, when the computer program product is loaded in the main memory of a computer and is carried out by the computer.

Memory device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc. The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network).

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

Furthermore, as used herein, the term "2D file library" refers to a given set of files that together define a single printed circuit boards including embedded chip components, or a plurality of printed circuit boards including embedded chip components used for a given purpose. It is noted that the 2D file library is of the substantially 2D representation image of the 2D layer without the chips. In other words, the pattern can include the leads and die pads representations without the 2D slice of the chip or chip package component. In another embodiment, the chip or chip package component representation can be converted to be printed.

The term "2D file library" can also be used to refer to a set of 2D files or any other raster graphic file format (the representation of images as a collection of pixels, generally in the form of a rectangular grid, e.g., BMP, PNG, TIFF, GIF), capable of being indexed, searched, and reassembled to provide the structural layers of a given printed circuit boards not including embedded chip components, whether the search is for the printed circuit boards including embedded chip components described herein, or a given specific layer without the embedded chip.

The Computer-Aided Design/Computer-Aided Manufacturing (CAD/CAM) generated information associated with the printed circuit boards including embedded chip components described herein to be fabricated, which is used in the methods, programs and libraries can be based on converted CAD/CAM data packages can be, for example, IGES, DXF, DWG, DMIS, NC files, GERBER® files, EXCELLON®, STL, EPRT files, an ODB, an ODB++, an .asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication and can precisely define the printed circuit boards including embedded chip components described herein image and the structure and color of the image (e.g., resin or metal), resulting in an efficient and effective transfer of fabrication data from design (3D visualization CAD e.g.) to fabrication (CAM e.g.). Accordingly and in an embodiment, using pre-processing algorithm, GERBER®, EXCELLON®, DWG, DXF, STL, EPRT ASM, and the like as described herein, are converted to 2D files.

A more complete understanding of the components, processes, assemblies, and devices disclosed herein can be obtained by reference to the accompanying drawings. These figures (also referred to herein as "FIGS.") are merely schematic representations (e.g., illustrations) based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 2B:
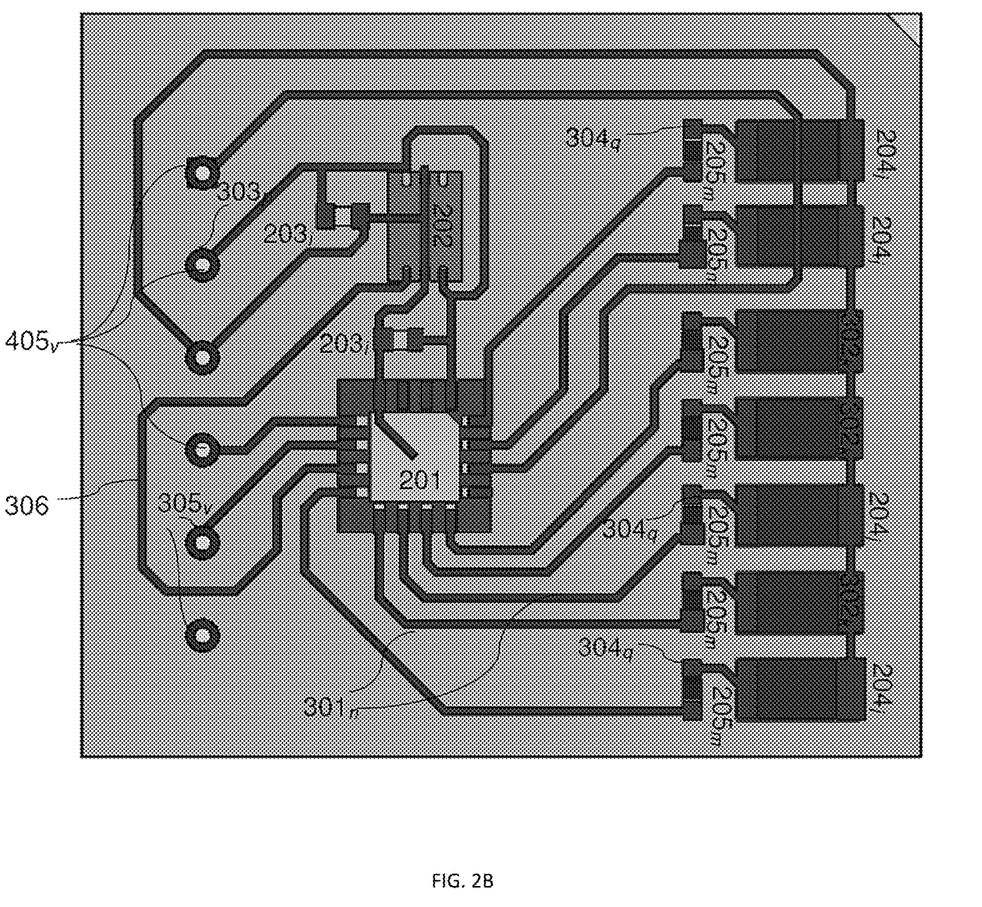
FIG. 2B illustrates a top plan view thereof.
Figure 2C:
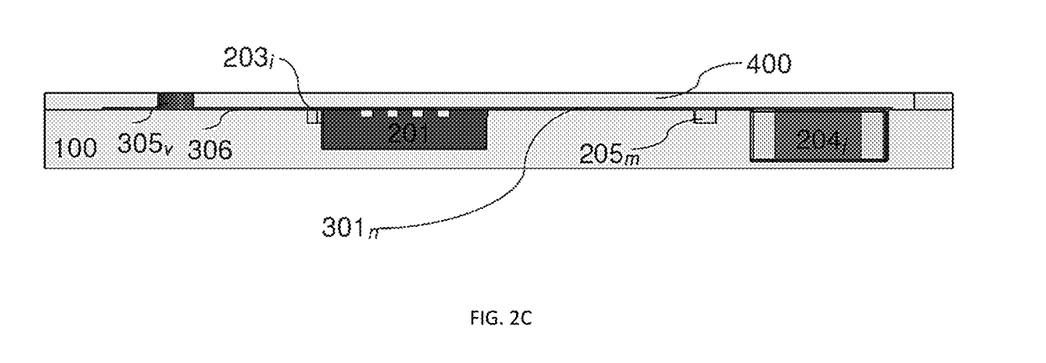
FIG. 2C illustrates a side elevation view thereof.

Turning to FIGS. 2A-3C illustrating the method of forming a printed circuit board having plurality of chips embedded therein. As illustrated using the systems and compositions described herein, using the CAM module, obtaining a generated file representing a first, substantially 2D layer of the printed circuit board including the embedded plurality of chips for printing, the 2D layer comprising a pattern representative of the insulating and/or dielectric resin inkjet ink, the conductive ink, wherein the pattern does not include any of the plurality of chips, or a combination comprising two or more; using the first print head, forming the pattern 100 corresponding to the insulating and/or dielectric resin representation in the first, substantially 2D layer of the printed circuit board not including the embedded plurality of chips (e.g., 201, 202,) for printing. As illustrated in FIG. 2 A, the pattern is built such that compartments 101 (e.g., for microprocessor 201), 102 (e.g., for thermal sensor 202) 103, (e.g., for capacitors 203$_i$), 104$_j$, (e.g., for LED chips 204$_j$), and 105$_m$ (e.g., for resistors 205$_m$) are printed and built up, such that each designated compartment is configured to precisely accommodate the component designated for that particular compartment. The 2D layer can be printed once or subsequently layer-by layer. since the height of the components, (e.g., LED chips 204$_j$, and resistors 205$_m$) is not identical, it is foreseeable that certain 2D layer representation, will include designated areas for building one compartment (e.g. 104$_j$) and not another compartment (e.g., 105$_m$). In an embodiment, the compartments are configured to have a top that is on a straight horizontal plane. However, this can be changed based on design constraints.

The pattern corresponding to the insulating and/or dielectric resin representation in the 2D layer of the printed circuit board not including the embedded plurality of chips, can then be cured.

Figure 3A:
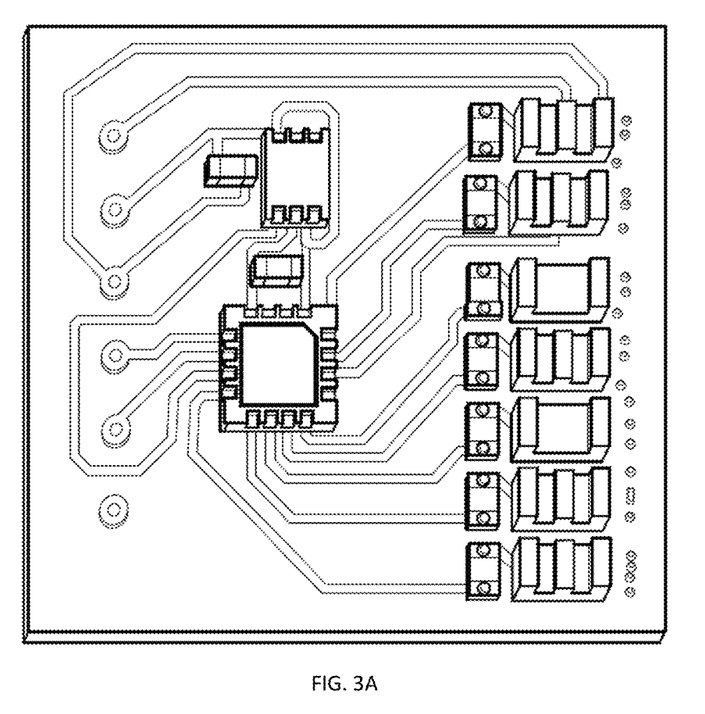
FIG. 3A illustrates a top plan view of the PCB of FIG. 2A as printed using the methods described herein, with manual placement of the QFN illustrated in FIG. 3B, and the completed embedded PCB illustrated in FIG. 3C.
Figure 3B:
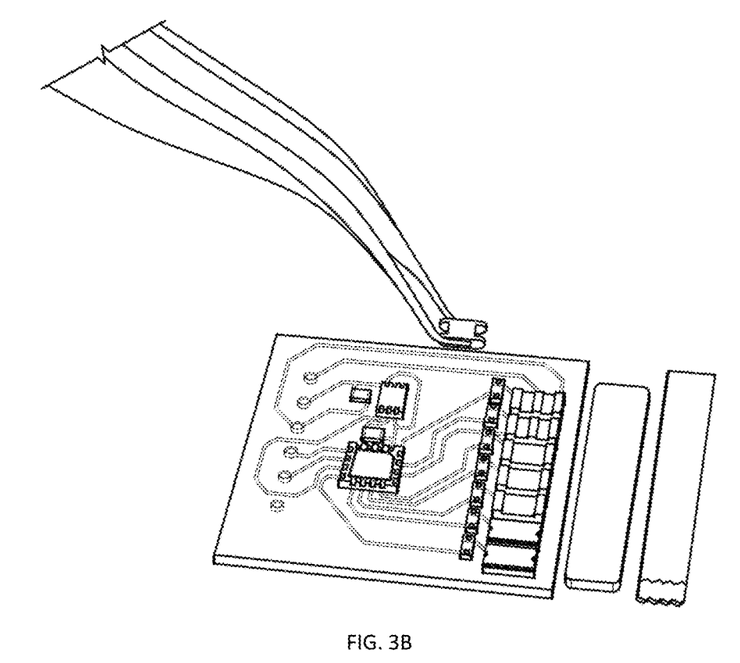

As illustrated in FIGS. 2A and 3B, at least two chips can then be placed in the designated area (in other words in the compartment corresponding to each chip (e.g., microprocessor 201), resistor, capacitor and other required components sought to be embedded on the first (or subsequent layer as necessary), substantially 2D layer of printed circuit board not including the embedded plurality of chips, wherein the chips are placed with a contact layer (e.g., 210, 212, in other words, the bond pad) being on top. This way, the chip or component is inverted, exposing the metalized contact apically in a single plane.

Then, using the second print head, forming the pattern corresponding to the conductive ink representation in the first, substantially 2D layer of printed circuit board, this time the pattern is including the plurality of chips sought to be embedded for printing. As illustrated, the conductive pattern can comprise traces leads from microprocessor 201 to resistor(s) 205$_m$. Further illustrated, are metallization cylinders 305$_v$, configured to form the metalized portion of blind vias 405$_v$ defined in embedding layer 400. Also illustrated or interconnects 304$_q$, configured to connect one electrode of each LED chip 204$_j$ to a corresponding resistors 205$_m$, as well as contact pad 302$_k$, configured to connect another electrode of LED chip 204$_j$ (here, in series) to capacitor(s) 203$_i$, being in communication with temperature sensor 202 (see e.g., FIG. 2B). Since the conductive pattern is printed layer-by-layer, interconnect(s) 304$_q$, do not necessarily need to be planar (e.g., in X-Y direction only) and can be printed in the three dimensions (e.g., in the Z direction as well). Likewsie and as disclosed herein, using additional print heads with additional conductive composition, it is possible, in certain embodiment to form metallization cylinders 305$_v$, configured to form the metalized portion of blind vias 405$_v$ defined in embedding layer 400, from one metal (e.g., Silver Ag), while interconnect 304$_q$, can be formed from a copper composition, thereby providing much greater flexibility.

The pattern corresponding to the conductive ink representation in the first, substantially 2D layer of printed circuit board including the embedded plurality of chips for printing can be sintered. It is noted that when two different metals are used in the conductive ink, sintering can take place in different methodologies, for example laser for one and heating for another. Using the conductive ink, the bonding pads or contacts can be connected without soldering, thus forming an integrated circuit.

Next, using the CAM module, obtaining a generated file representing a substantially 2D layer of the printed circuit board including the embedded plurality of chips for printing, the 2D layer comprising a pattern representative of the insulating and/or dielectric resin inkjet ink wherein the pattern 400 is configured to embed the plurality of chips within the printed circuit board; using the first print head, forming the pattern corresponding to the insulating and/or dielectric resin representation in the substantially 2D layer of the printed circuit board, this time including, or accounting for the location of the plurality of chips sought to be embedded within the printed circuit board; and curing the pattern corresponding to the insulating and/or dielectric resin representation thereby embedding the plurality of chips. As illustrated, blind vias 405$v$ can be defined around contact cylinders 305$v$. Also illustrated is the conductive ink composition pattern.

Figure 3C:
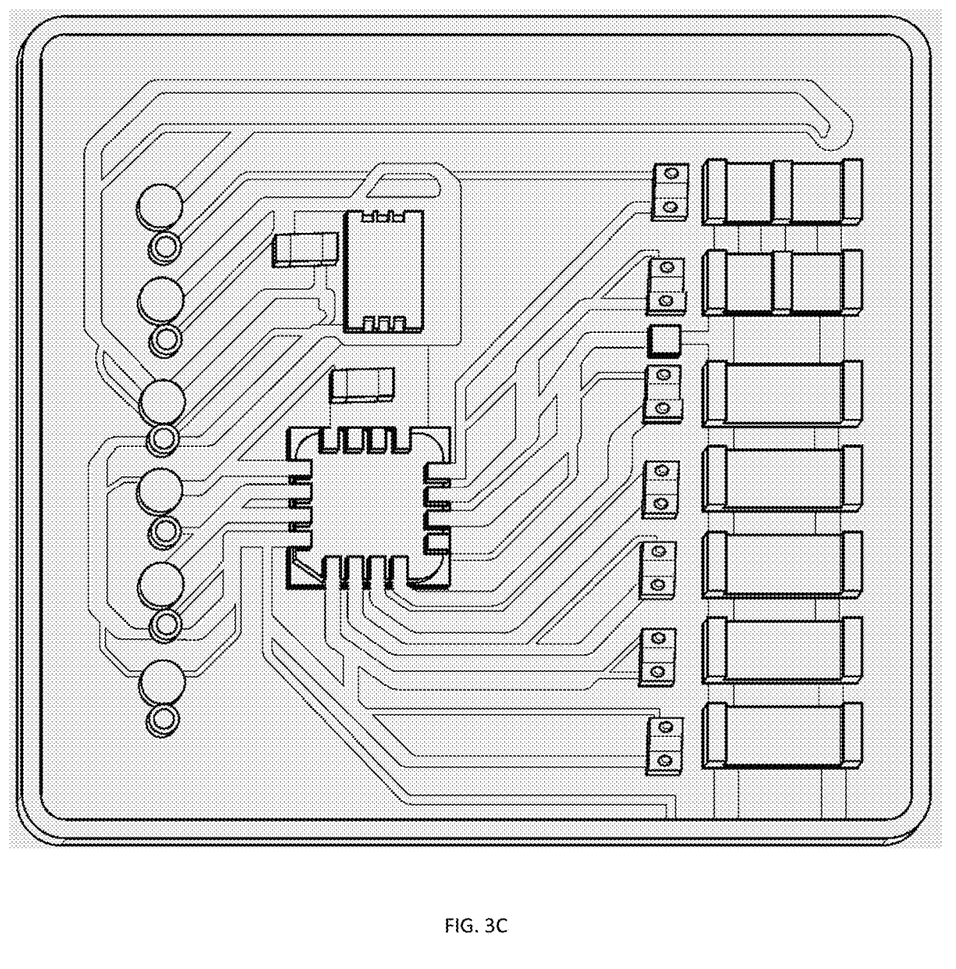

As illustrated in FIGS. 3A-3C, the method can be used to directly print an integrated circuit with fully embedded components. It is noted, that the additive manufacturing in the methods described herein, is top down, while, as seen in FIG. 1, current methods of embedding components in PCBs, is bottom-up.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the print head(s) includes one or more print head). Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Therefore, in an embodiment provided herein is a method for embedding a plurality of chips in a printed circuit board using inkjet printer comprising: providing an ink jet printing system having: a first print head having: at least one aperture, a insulating and/or dielectric resin ink reservoir, and a insulating and/or dielectric resin pump configured to supply insulating and/or dielectric resin inkjet ink through the aperture; a second print head having: at least one aperture, a conductive ink reservoir, and a conductive ink pump configured to supply the conductive ink through the aperture; a conveyor, operably coupled to the first, the second, the third, and the fourth print heads configured to convey a substrate to each of the first, second, third, and fourth print heads; and a computer aided manufacturing ("CAM") module, comprising: a data processor; a non-volatile memory; and a set of executable instructions stored on the non-volatile memory for: receiving a 3D visualization file representing the printed circuit board including the embedded plurality of chips; generating a file that represents at least one, substantially 2D layer for printing the printed circuit board including the embedded plurality of chips, wherein the file representing the at least one, substantially 2D layer does not include a representation of any of the plurality of chips, creating a substantially 2D representation image of the substantially 2D layer without the chips; receiving a selection of parameters related to the printed circuit board including the embedded plurality of chips; and altering the file represents at least one, substantially 2D layer based on at least one of the selection of parameters, wherein the CAM module is configured to control each of the print heads; providing the insulating and/or dielectric resin inkjet ink composition and the conductive ink composition; using the CAM module, obtaining a generated file representing a first, substantially 2D layer of the printed circuit board including the embedded plurality of chips for printing, the 2D layer comprising a pattern representative of the insulating and/or dielectric resin inkjet ink, the conductive ink, wherein the pattern does not include any of the plurality of chips, or a combination comprising two or more; using the first print head, forming the pattern corresponding to the insulating and/or dielectric resin representation in the first, substantially 2D layer of the printed circuit board not including the embedded plurality of chips for printing; curing the pattern corresponding to the insulating and/or dielectric resin representation in the 2D layer of the printed circuit board not including the embedded plurality of chips, the pattern defining a designated area for each of the plurality of chips, resistors, capacitors and any other associated component; placing at least two chips in a designated area on the first, substantially 2D layer of printed circuit board not including the embedded plurality of chips, wherein the chips are placed with a contact layer being on top; using the second print head, forming the pattern corresponding to the conductive ink representation in the first, substantially 2D layer of printed circuit board including the embedded plurality of chips for printing; sintering the pattern corresponding to the conductive ink representation in the first, substantially 2D layer of printed circuit board including the embedded plurality of chips for printing; using the CAM module, obtaining a generated file representing a substantially 2D layer of the printed circuit board including the embedded plurality of chips for printing, the 2D layer comprising a pattern representative of the insulating and/or dielectric resin inkjet ink wherein the pattern is configured to embed the plurality of chips within the printed circuit board; using the first print head, forming the pattern corresponding to the insulating and/or dielectric resin representation in the substantially 2D layer of the printed circuit board including the embedded plurality of chips configured to embed the plurality of chips within the printed circuit board; and curing the pattern corresponding to the insulating and/or dielectric resin representation thereby embedding the plurality of chips, further comprising (i) prior to the step of placing at least two chips in the designated area on the first, substantially 2D layer of printed circuit board not including the embedded plurality of chips, using the CAM module, obtaining a generated file representing a, substantially 2D layer of the printed circuit board not including the plurality of embedded chips for printing subsequent to the first layer; and repeating the steps for forming a subsequent layer of the insulating and/or dielectric resin, wherein (ii) the step of curing the first layer comprises heating, photopolymerizing, drying, depositing plasma, annealing, facilitating redox reaction, or a combination comprising one or more of the foregoing, wherein (iii) the conductive ink composition comprises: metal nanoparticles having average diameter $D_{2,1}$ particle size between about 20 nm and about 150 nm; and optionally a solvent, wherein (iv) the aspect ratio of the metal nanoparticles is substantially larger than 1 ($\gg 1$), wherein (v) the insulating and/or dielectric resin ink is a solution of a multifunctional acrylate monomer, oligomer, polymer or their combination; a cross-linking agent; and a radical photinitiator, wherein (vi) the insulating and/or dielectric resin is: polyester (PES), polyethylene (PE), polyvinyl alcohol (PVOH), poly(vinylacetate) (PVA), poly-methyl methacrylate (PMMA), Poly(vinylpirrolidone), or a combination comprising a mixture or a copolymer of one or more of the foregoing, wherein (vii) the plurality of chips comprise chip package, (viii) the chip package is a Quad Flat Pack (QFP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Quad Flat No-Lead (QFN) package, a Land Grid Array (LGA) package, a passive component, or a combination comprising two or more of the foregoing, wherein (ix) the parameters used in the selection of parameters related to the printed circuit board including the plurality of embedded chips are; the insulating and/or dielectric resin ink pattern in the layer, the conductive ink pattern in the layer, curing requirements for the insulating and/or dielectric resin, sintering for the conductive ink pattern in the layer, location and/or type of each chip, throughput requirement, or a combination of parameters comprising one or more of the foregoing, wherein (x) the 3D visualization file representing the printed circuit board including the plurality of embedded chips is an ODB, an ODB++, an .asm, an STL, an IGES, a STEP, a Catia, a SolidWorks, a Autocad, a ProE, a 3D Studio, a Gerber, a Rhino a Altium, an Orcad, an Eagle file or a file comprising one or more of the foregoing; and wherein file that represents at least one, substantially 2D layer is a JPEG, a GIF, a TIFF, a BMP, a PDF file, or a combination comprising one or more of the foregoing, wherein (xi) the inkjet printing system further comprises an additional print head having: at least one aperture, a second insulating and/or dielectric resin ink reservoir, and a second insulating and/or dielectric resin ink pump configured to supply the second insulating and/or dielectric resin ink through the aperture, the method further comprising: providing a second insulating and/or dielectric resin ink composition; using the second insulating and/or dielectric resin ink print head, forming a predetermined pattern corresponding to the second insulating and/or dielectric resin ink representation in the first, substantially 2D layer of the printed circuit board not including the plurality of embedded chips for printing; and curing or the predetermined pattern corresponding to the second insulating and/or dielectric resin representation in the 2D layer of the circuit board not including the embedded plurality of chips, wherein the second insulating and/or dielectric resin ink composition has a different ink composition than the insulating and/or dielectric resin ink composition in the first print head, wherein (xii) the inkjet printing system further comprises an additional print head having: at least one aperture, a second conductive ink reservoir, and a second conductive ink pump configured to supply the second conductive ink through the aperture, the method further comprising: providing a second conductive ink composition; using the second conductive ink print head, forming a predetermined pattern corresponding to the second conductive ink representation in the first, substantially 2D layer of the printed circuit board not including the plurality of embedded chips for printing; and sintering, the predetermined pattern corresponding to the second conductive ink representation in the 2D layer of the circuit board not including the plurality of embedded chips, wherein the second conductive ink composition has a different metal than the conductive ink composition in the second print head, wherein (xiii) the inkjet printing system further comprises an additional print head having: at least one aperture, a support ink reservoir, and a support ink pump configured to supply the support ink through the aperture, the method further comprising: providing a support ink composition; before, simultaneously with, or subsequent to the step of using the first print head and/or the second print head, using the support ink print head, forming a predetermined pattern corresponding to the support representation in the first, substantially 2D layer of the printed circuit board not including the plurality of embedded chips for printing; and functionalizing the predetermined pattern corresponding to the support representation in the 2D layer of the circuit board not including the plurality of embedded chips, wherein (xiv) the inkjet printing system further comprises a robotic arm, the method further comprising: using the robotic arm, placing the at least two chips in the designated area on the first, substantially 2D layer of printed circuit board not including the embedded plurality of chips, wherein (xv) the insulating and/or dielectric resin ink composition is configured to adhere to the conductive resin ink composition, wherein (xvi) the first, substantially 2D layer of the printed circuit board not including the embedded plurality of chips for printing comprises a pattern configured to print a designated area for resistor(s), transistor(s), capacitor(s), sensor(s), via(s) or a combination comprising the foregoing, wherein (xvii) the pattern representative of the conductive ink is configured to fabricate interconnect balls, wherein (xviii) the first conductive ink comprises silver and the second conductive resin comprises copper, and wherein the second conductive ink is configured to form a bond to a lead, and wherein (xix) the second dielectric resin ink is configured to form a mold frame on a chip.

Although the foregoing disclosure for 3D printing of printed circuit boards including embedded chip components using inkjet printing based on converted 3D visualization CAD/CAM data packages has been described in terms of some embodiments, other embodiments will be apparent to those of ordinary skill in the art from the disclosure herein. Moreover, the described embodiments have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed:

1. A method for embedding a plurality of chips in a printed circuit board using inkjet printer comprising:
   a. providing an ink jet printing system having:
      i. a first print head having: at least one aperture, a insulating and/or dielectric resin ink reservoir, and a insulating and/or dielectric resin pump configured to supply insulating and/or dielectric resin inkjet ink through the aperture;
      ii. a second print head having: at least one aperture, a conductive ink reservoir, and a conductive ink pump configured to supply the conductive ink through the aperture;
      iii. a conveyor, operably coupled to the first, and the second print heads configured to convey a substrate to each of the first, and second print heads; and
      iv. a computer aided manufacturing ("CAM") module, comprising: at least one data processor; a non-volatile memory; and a set of executable instructions stored on the non-volatile memory, configured when executed by the at least one data processor to cause the CAM to perform the steps of:
1. receiving a 3D visualization file representing the printed circuit board that includes the embedded plurality of packaged chip components sought to be embedded;
2. generating a raster files' library, each raster file representing a substantially 2D layer file for printing, the raster files' library consisting essentially of:
   a. raster files of a substantially 2D layer having both a pattern representing an insulating and/or dielectric pattern, and a conductive pattern;
   b. raster files of substantially 2D layer for printing without representation of any of the plurality of chip packages, configured, when printed layer-by-layer, to form a plurality of designated compartment each accommodating a particular chip package; and
   c. raster files of substantially 2D layer for printing with representation of the plurality of chip packages, configured, when printed layer-by-layer, to cover the plurality of designated compartment each accommodating the particular chip package; and
3. receiving a selection of parameters related to the printed circuit board including the embedded plurality of chips;

wherein the CAM module is configured to control each of the print heads and the conveyor;
b. providing the insulating and/or dielectric resin inkjet ink composition and the conductive ink composition;
c. using the CAM module, obtaining from the raster files' library a generated raster file of the insulating and/or dielectric and the conductive pattern representing a first, substantially 2D layer of the printed circuit board for printing without representation of any of the plurality of chip packages;
d. using the first print head, printing the pattern corresponding to the insulating and/or dielectric resin representation in the generated raster file of the insulating and/or dielectric and the conductive pattern representing the first, substantially 2D layer of the printed circuit board for printing without representation of any of the plurality of chip packages of the first layer on the substrate;
e. curing the printed pattern corresponding to the insulating and/or dielectric resin representation in the generated raster file of the insulating and/or dielectric and the conductive pattern representing the first, substantially 2D layer of the printed circuit board for printing without representation of any of the plurality of chip packages of the first layer;
f. using the second print head, printing the conductive pattern representation in the generated raster file of the insulating and/or dielectric and the conductive pattern representing the first, substantially 2D layer of the printed circuit board for printing without representation of any of the plurality of chip packages of the first layer;
g. sintering the printed conductive pattern in the generated raster file of the insulating and/or dielectric and the conductive pattern representing the first, substantially 2D layer of the printed circuit board for printing without representation of any of the plurality of chip packages of the first layer h. using the CAM module, obtaining from the raster files' library, a subsequent generated raster file of the insulating and/or dielectric and the conductive pattern representing at least one subsequent substantially 2D layer without representation of any of the plurality of chip packages;
i. using the first print head, printing the pattern corresponding to the insulating and/or dielectric resin representation of the generated raster file of the insulating and/or dielectric and the conductive pattern in the subsequent substantially 2D layer without representation of any of the plurality of chip packages;
j. curing the printed pattern corresponding to the insulating and/or dielectric resin representation in the subsequent substiantlly 2D layer without representation of any of the plurality of chip packages;
k. using the second print head, printing the conductive pattern representation in the subsequent substantially 2D layer wihtout representation of any of the plurality of chip packages;
l. sintering the printed conductive pattern in the subsequent substantially 2D layer without representation of any of the plurality of chip packages;
m. repeating steps h-l thereby forming a plurality of designated compartment each configured and shaped to accommodate a particular chip package;
n. placing at least two chip packages, each in its particular designated compartment, wherein the chip packages are placed upside-down with at least one of a bond pad, and legs of the chip packages being on top;
o. using the CAM module, obtaining from the raster files' library a generated raster file of insulating and/or dielectric ink pattern, and conductive ink pattern representing a substantially 2D layer of the printed circuit board with representation of the placed chip packages, the conductive ink pattern configured to interconnect the at least one of: the bond pad, and the legs of the placed chip package;
p. using the second print head, printing the conductive ink pattern in the generated raster file obtained of substantially 2D layer for printing with representation of the placed chip packages;
q. sintering the conductive ink pattern;
r. using the first print head, printing the pattern corresponding to the insulating and/or dielectric resin in the generated raster file obtained of substantially 2D layer for printing with representation of the placed chip packages configured to embed the placed chips packages within the printed circuit board;
s. curing the printed pattern corresponding to the insulating and/or dielectric resin representation in the generated raster file obtained of substantially 2D layer for printing with representation of the placed chip packages configured to embed the placed chips packages within the printed circuit board; and
t. repeating steps o-t, thereby embedding the plurality of chips in the printed circuit board.

2. The method of claim 1, wherein in each of steps e., step j. and step s. the corresponding insulating and/or dielectric patterns are cured by heating, photo polymerizing, drying, depositing plasma, annealing, facilitating redox reaction, or a combination comprising one or more of the foregoing.

3. The method of claim 2, wherein the conductive ink composition comprises: metal nanoparticles having average diameter $D_{2,1}$ particle size between about 20 nm and about 150 nm; and optionally a solvent.

4. The method of claim 3, wherein the aspect ratio of the metal nanoparticles is substantially larger than 1.

5. The method of claim 4, wherein the insulating and/or dielectric resin ink is a solution of a multifunctional acrylate monomer, oligomer, polymer or their combination; a cross-linking agent; and a radical photoinitiator.

6. The method of claim 5, wherein the insulating and/or dielectric resin is: polyester (PES), polyethylene (PE), polyvinyl alcohol (PVOH), poly(vinylacetate) (PVA), polymethyl methacrylate (PMMA), Poly(vinylpirrolidone), or a combination comprising a mixture or a copolymer of one or more of the foregoing.

7. The method of claim 6, wherein the plurality of chip components, each is a chip package.

8. The method of claim 7, wherein the chip package is a Quad Flat Pack (QFP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Quad Flat No-Lead (QFN) package, a Land Grid Array (LGA) package, a passive component, or a combination comprising two or more of the foregoing.

9. The method of claim 8, wherein the parameters used in the selection of parameters related to the printed circuit board that includes the plurality of chip components sought to be embedded are; the insulating and/or dielectric resin ink pattern in the layer, the conductive ink pattern in the layer, curing requirements for the insulating and/or dielectric resin, sintering for the conductive ink pattern in the layer, location and/or type of each chip component, throughput requirement, or a combination of parameters comprising one or more of the foregoing.

10. The method of claim 1, wherein the 3D visualization file representing the printed circuit board including the plurality of embedded chips is an ODB, an ODB++, an .asm, an STL, an IGES, a STEP, a Catia, a SolidWorks, a Autocad, a ProE, a 3D Studio, a Gerber, a Rhino a Altium, an Orcad, an Eagle file or a file comprising one or more of the foregoing; and wherein file that represents at least one, substantially 2D layer is a JPEG, a GIF, a TIFF, a BMP, a PDF file, or a combination comprising one or more of the foregoing.

11. The method of claim 1, wherein the inkjet printing system further comprises an additional print head having: at least one aperture, a support ink reservoir, and a support ink pump configured to supply the support ink through the aperture, the method further comprising:
 a. providing a support ink composition;
 b. before, simultaneously with, or subsequent to the step of using the first print head and/or the second print head, using the support ink print head, forming a predetermined pattern corresponding to the support representation in the layer; and
 c. functionalizing the predetermined pattern corresponding to the support ink representation first layer.

12. The method of claim 1, wherein the plurality of raster files, each representing an insulating and/or dielectric pattern of at least one, substantially 2D layer, comprises a pattern configured, when printed layer-by-layer, to form a plurality of designated compartment configured to accommodate resistor(s), transistor(s), capacitor(s), sensor(s), or a combination comprising the foregoing.

13. The method of claim 1, wherein the pattern representative of the conductive ink is configured to fabricate interconnect balls.

* * * * *